United States Patent
Cheng et al.

(10) Patent No.: US 8,295,041 B2
(45) Date of Patent: Oct. 23, 2012

(54) SERVER CABINET, SERVER SYSTEM AND DATA CENTER

(75) Inventors: Hao-Der Cheng, Taipei Hsien (TW); Wen-Tang Peng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 212 days.

(21) Appl. No.: 12/868,679

(22) Filed: Aug. 25, 2010

(65) Prior Publication Data
US 2011/0157818 A1   Jun. 30, 2011

(30) Foreign Application Priority Data
Dec. 30, 2009   (TW) ................................ 98145752 A (51) Int. Cl.
*H05K 7/20*   (2006.01)
(52) U.S. Cl. ............ 361/679.48; 361/694; 361/695; 454/184; 165/80.3
(58) Field of Classification Search ......... 361/679.32–679.33, 679.39, 679.46, 361/679.48, 679.49, 679.51, 679.54, 688, 361/694, 695, 727
See application file for complete search history.

(56) References Cited

U.S. PATENT DOCUMENTS

| | | | | |
|---|---|---|---|---|
| 4,130,376 | A * | 12/1978 | Dietsche | 415/213.1 |
| 6,678,157 | B1 * | 1/2004 | Bestwick | 361/695 |
| 6,929,336 | B2 * | 8/2005 | Liu et al. | 312/223.1 |
| 8,120,911 | B2 * | 2/2012 | Zhou et al. | 361/695 |
| 2005/0024825 | A1 * | 2/2005 | Smith et al. | 361/687 |
| 2006/0279929 | A1 * | 12/2006 | Chen | 361/697 |
| 2007/0041157 | A1 * | 2/2007 | Wang | 361/687 |
| 2009/0154092 | A1 * | 6/2009 | Chen | 361/679.51 |
| 2009/0261699 | A1 * | 10/2009 | Yu et al. | 312/334.46 |
| 2011/0024592 | A1 * | 2/2011 | Yu et al. | 248/309.1 |
| 2011/0122573 | A1 * | 5/2011 | Peng et al. | 361/679.48 |
| 2012/0069514 | A1 * | 3/2012 | Ross | 361/679.33 |
| 2012/0099270 | A1 * | 4/2012 | Xu et al. | 361/679.49 |

* cited by examiner

*Primary Examiner* — Courtney Smith
*(74) Attorney, Agent, or Firm* — Altis Law Group, Inc.

(57) ABSTRACT

An exemplary data center includes two server systems arranged back to back. Each server system includes a server cabinet, a rail system, at least two servers and a fan module. The servers are accommodated in the server cabinet. The fan module is located at a rear side of the two servers and perpendicular to the servers to provide a horizontal airflow to cool the servers. The fan module is capable of rolling on the rail system between a rear side and a front side of the server cabinet to interchange between a vertical state and a horizontal state. Assembly or disassembly of the fan module is performed from the front side of the server cabinet where there is a greater amount of workspace.

13 Claims, 9 Drawing Sheets

SERVER CABINET, SERVER SYSTEM AND DATA CENTER

BACKGROUND

1. Technical Field

The present disclosure relates to a computer server system, and more particularly to a server system having a server cabinet which is convenient for assembling/disassembling a fan module in the server cabinet, and a data center having at least two of the server systems.

2. Description of Related Art

Data centers are commonly used to process and store data and information in networks in the art. Typically, a data center includes a plurality of server systems arranged back to back. Each server system includes a cabinet and multiple servers mounted in the cabinet. A plurality of fans is arranged in the back of the cabinet for dissipating the heat generated by the servers during operation. Since there is often not enough space between two adjacent servers, it is not convenient for assembling/disassembling the fans in the sever systems when the fans need to be replaced or cleaned.

Accordingly, what is desired is a server system of a data center that can overcome the above-described limitations.

DETAILED DESCRIPTION

Figure 1:
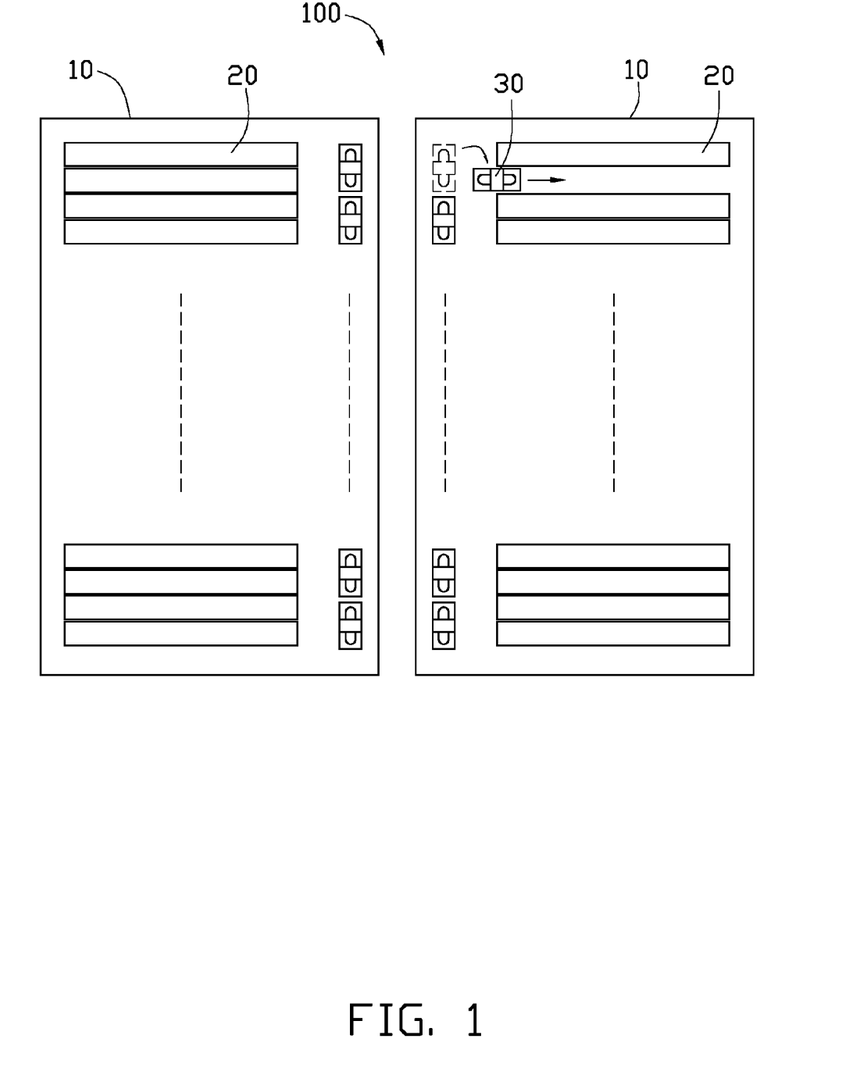
FIG. 1 is a schematic view of a data center in accordance with a first embodiment of the present disclosure.

Referring to FIG. 1, a data center according a first embodiment of the present disclosure is shown. The data center comprises multiple server systems 100, and in FIG. 1, two server systems 100 are shown for an example. The server systems 100 are arranged back to back. Each server system 100 comprises a server cabinet 10, a plurality of servers 20 stacked in the server cabinet 10, and a plurality of fan modules 30 positioned in the rear side of the servers 20. Multiple neighboring servers 20 can share the fan module 30 in the server system 100. In this embodiment, two neighboring servers 20 share the fan module 30.

Figure 2:
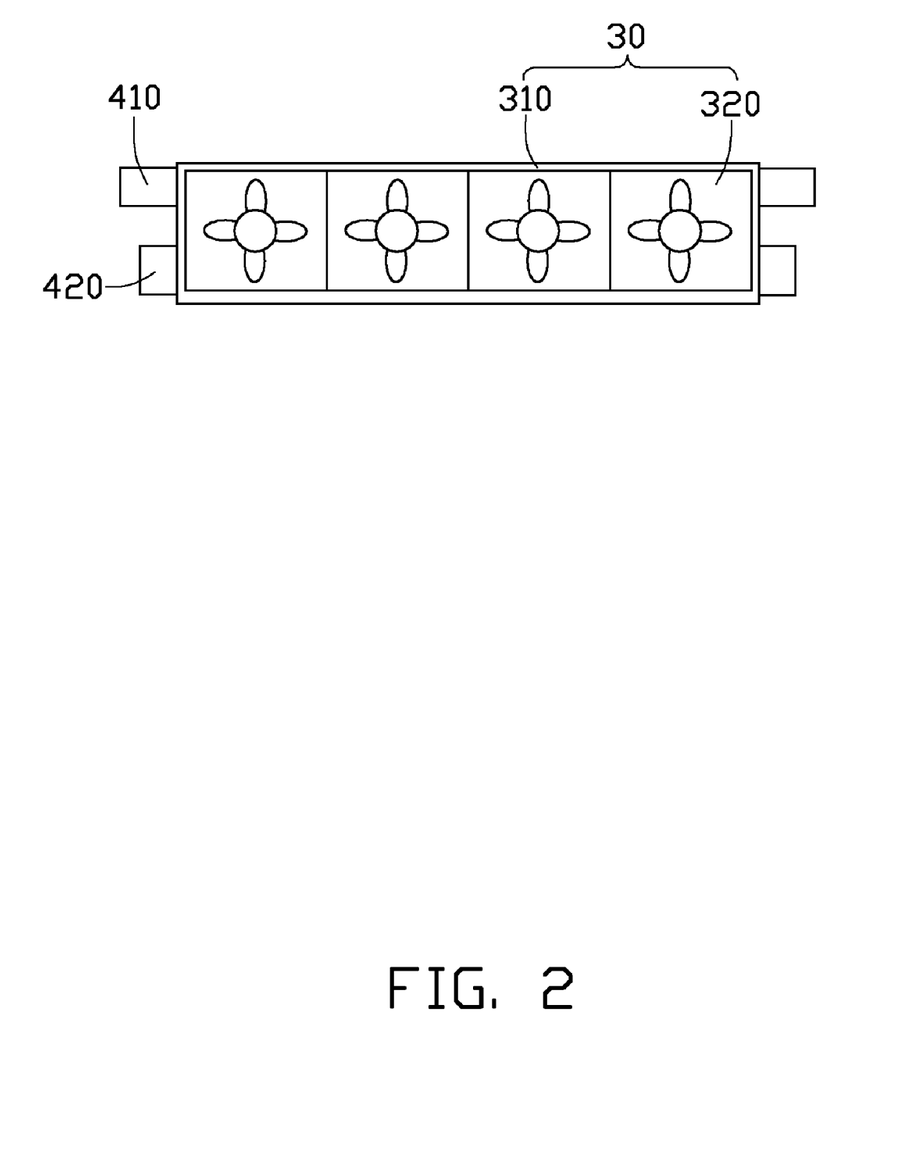
FIG. 2 is a schematic view of a fan module in a server system of the data center in FIG. 1, viewed vertically.
Figure 3:
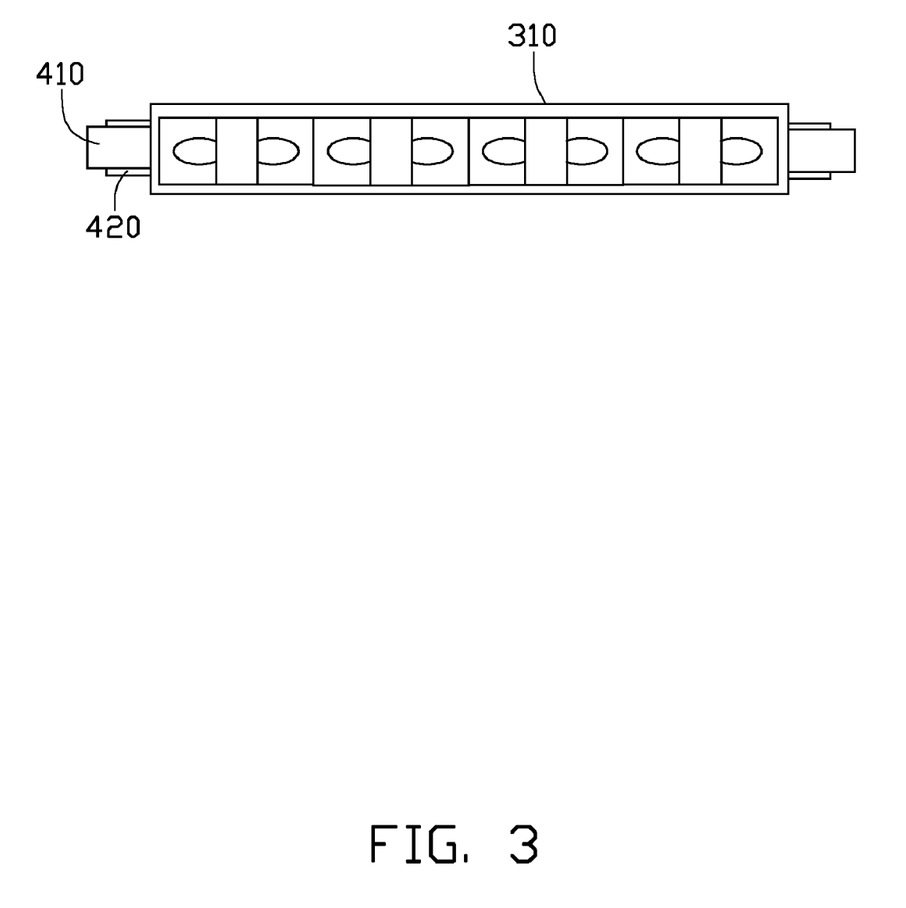
FIG. 3 is another schematic view of the fan module in FIG. 2, viewed horizontally.

Referring to FIGS. 2 and 3, the fan module 30 comprises a rectangular frame 310 and a plurality of fans 320 rotatably accommodated in the frame 310 in a line. A pair of first rollers 410 extends horizontally from upper portions of two ends of the frame 310. That is, each first roller 410 extends from the upper portion of each end of the frame 310. A pair of second rollers 420 extends horizontally from lower portions of two ends of the frame 310. The first and second rollers 410, 420 have a columned shape. The first rollers 410 are narrower, but longer than the second rollers 420.

Figure 4:
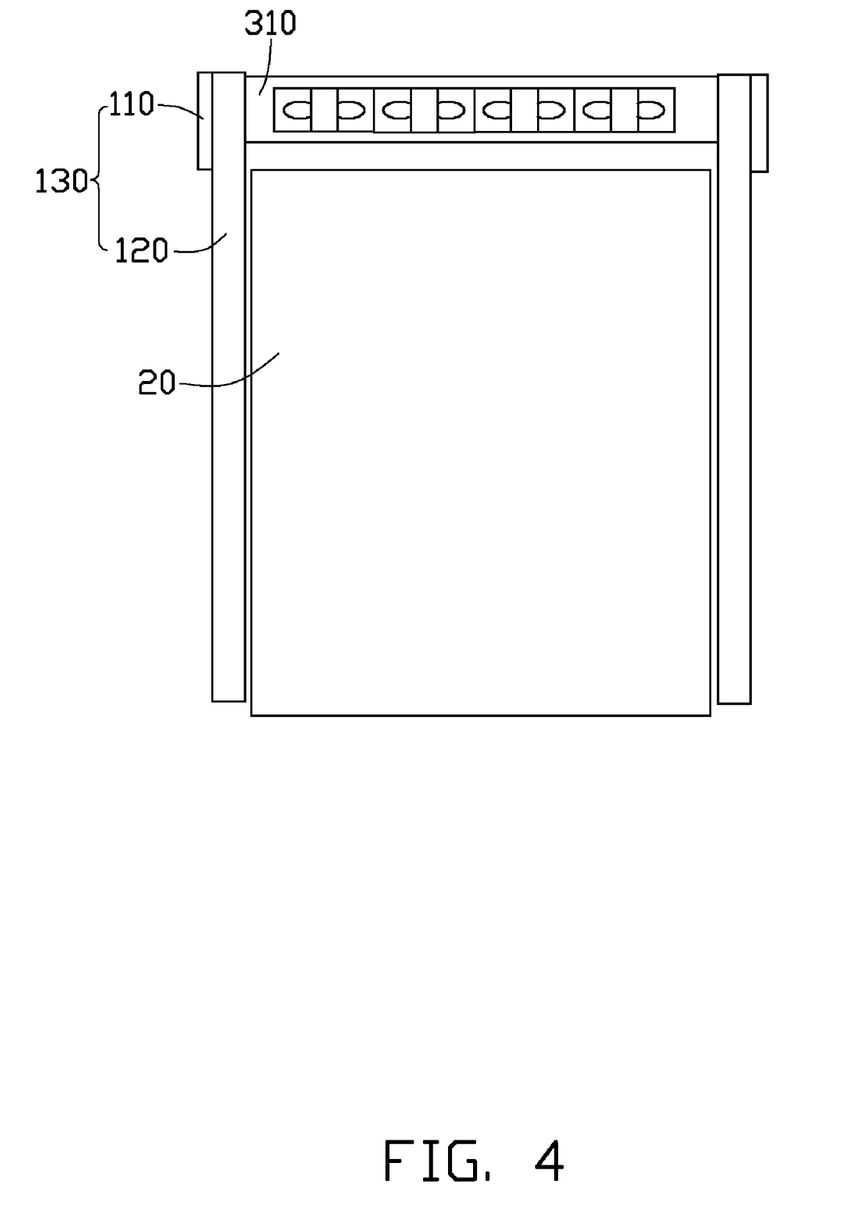
FIG. 4 is a schematic view of a server system of the data center in FIG. 1, showing the connection of a pair of first rails, a pair of second rails, servers and the fan module.
Figure 5:
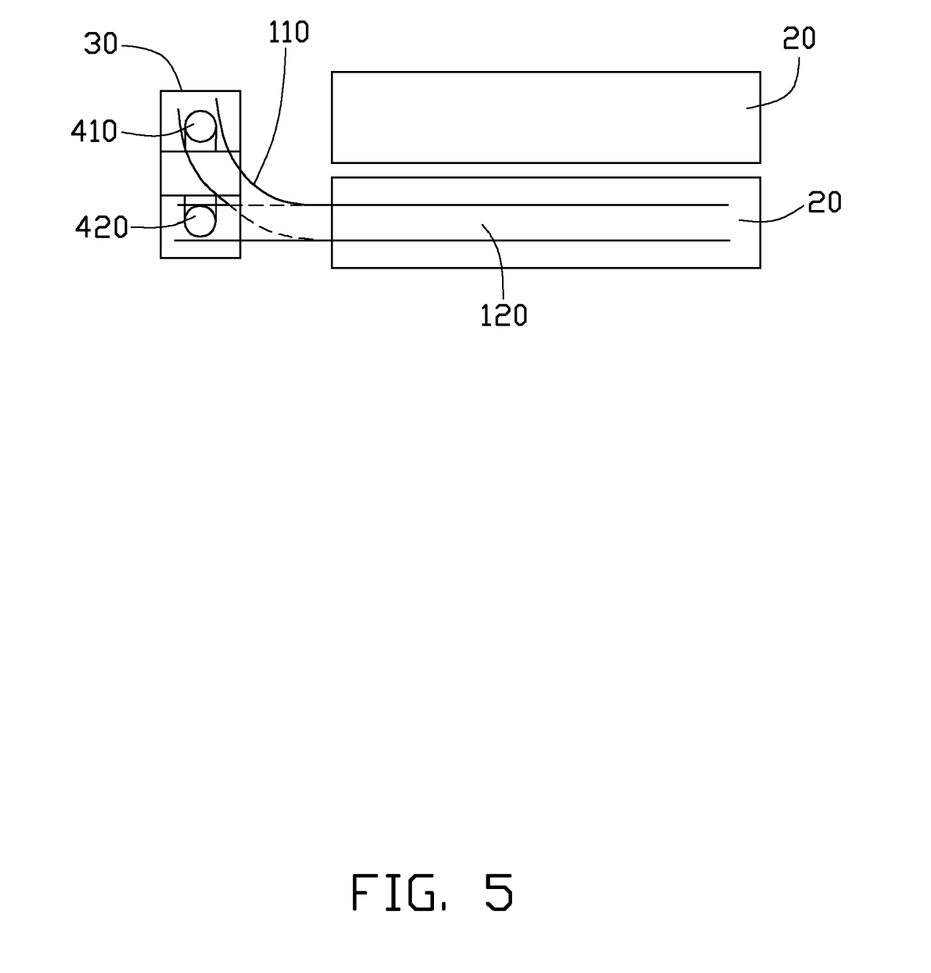
FIG. 5 is a schematic, lateral view of the server system in FIG. 4.

Referring to FIGS. 4 and 5, the server cabinet 10 comprises multiple pairs of first rails 110 and second rails 120. Each pair of second rails 120 extends from the front side of the server cabinet 10 to the rear side of the server cabinet 10. The sever 20 can slide on the pair of the second rails 120. In this embodiment, each pair of second rails 120 is provided for each server 20, and two neighboring servers 20 share the fan module 30. Therefore, in a range of the height of the fan module 30, there are two pairs of second rails 120 and two servers 20. The fan module 30 is positioned at the rear side of the servers 20 and is perpendicular to the second rails 120 to provide cool air along a horizontal direction for the servers 20. The first rail 110 interconnects the second rail 120, which is at the lower portion of the fan module 30. The first and second rails 110, 120 cooperate to form a rail system 130. The first and second rollers 410, 420 of the fan module 30 are glidingly engaged in the rail system 130. The fan module 30 is capable of sliding on the first and second rails 110, 120.

The first rail 110 has an arc shape and curves out and up from a rear portion of the second rail 120. There is a predetermined distance between the rear end of the second rail 120 and the curved position of first rail 110, namely, the curved position of the first rail 110 extends at the rear end of the second rail 120. The cross section of the first and second rails has a substantially "[" shape which includes top and bottom walls and a lateral wall interconnecting the top and bottom walls, leaving an opening oriented to the server 20. The height of the second rail 120 (i.e., the distance between the top and bottom walls of the second rail 120) is substantially equal to the diameter of the second roller 420. The width of the second rail 120 (i.e., the width of the top or bottom wall) is substantially equal to the longitudinal length of the second roller 420. The second rail 120 is configured for fitly receiving the second roller 420 therein. The height of the first rail 110 is smaller than the second rail 120, and is substantially equal to the diameter of the first roller 410. Therefore, only the first roller 410 can slide in the first rail 110, and the second roller 420 having a larger diameter cannot slide into the first rail 110. The width of the first rail 110 is substantially equal to the longitudinal length of the first roller 410. The second rail 120 defines a longitudinal slot in the lateral wall thereof for the first roller 410 extending through when the first roller 410 slides in the second rail 120.

As shown in FIG. 5, when the fan module 30 is in a fixing state, the pair of first rollers 410 is engaged in the top of the pair of first rail 110, and the pair of second rollers 420 is engaged in the rear end of the pair of second rails 120. The pairs of the first and second rollers 410, 420 are in a same vertical plane, and the fan module 30 is perpendicular to the second rails 120.

Figure 6:
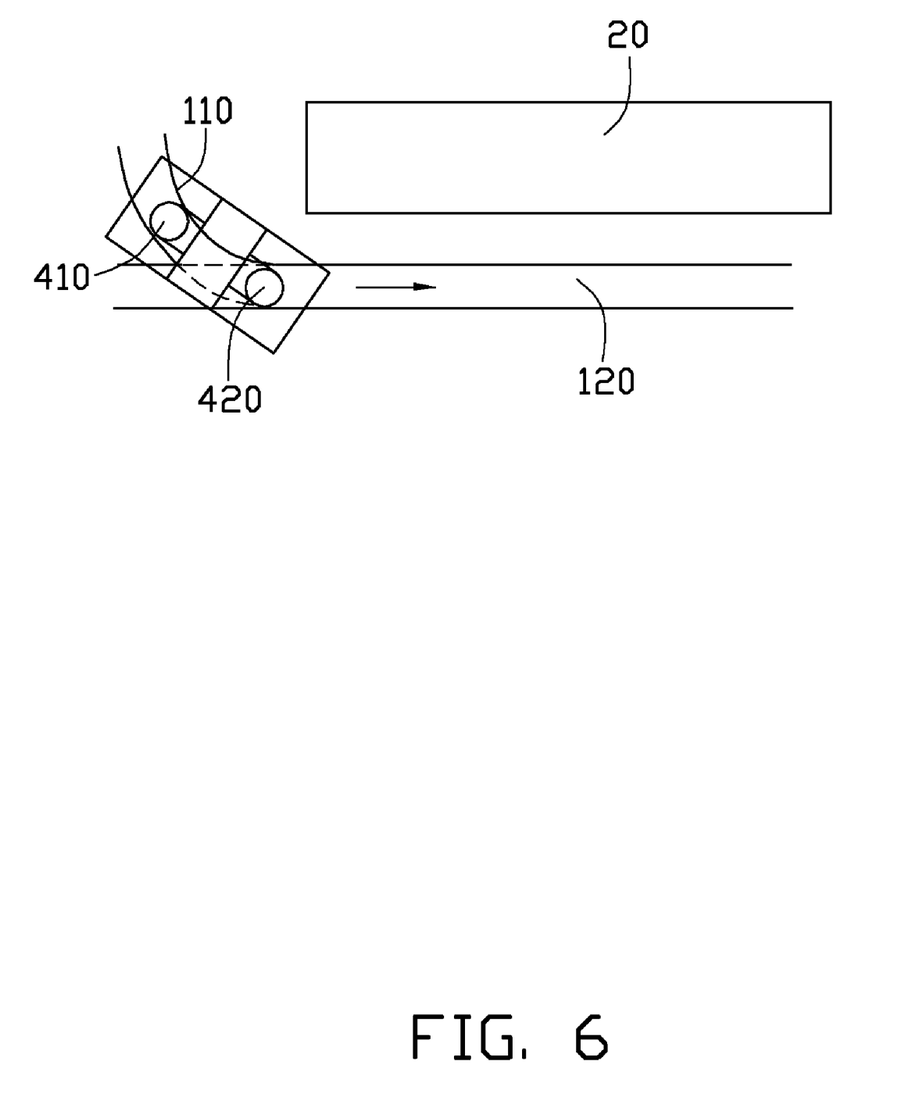
FIG. 6 is another schematic, lateral view of the server system in FIG. 4, showing the fan module sliding on the first and second rails after a server of the server system having been taken out therefrom.
Figure 7:
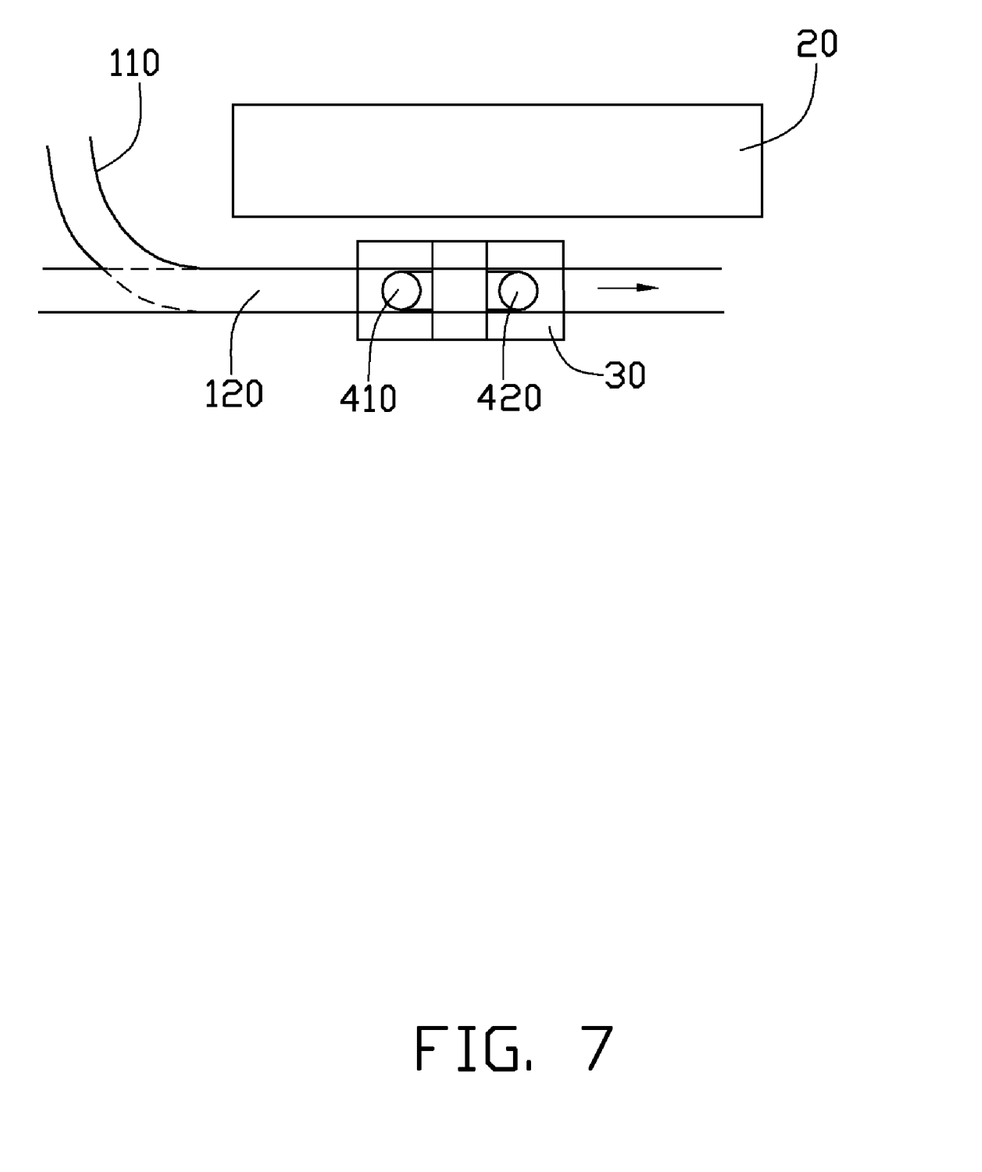
FIG. 7 is similar to FIG. 6, but showing the fan module moving horizontally along the second rails.

As shown in FIG. 6, when the fan module 30 needs to be replaced, the sever 20 blocking the second rails 120 is firstly carried out of the server cabinet 10 along the second rails 120, providing a passage for the first and second rollers 410, 420 of the fan module 30. The fan module 30 is pulled out, the second rollers 420 roll forwards along the second rails 120, and the first rollers 410 roll down along the first rails 110. As shown in FIG. 7, the fan module 30 rolls along the second rails 120 in a horizontal state, until it rolls out of the server cabinet 10 from the front side thereof.

In assembling the fan module 30 in the server cabinet 10, the first and second rollers 410, 420 of the fan module 30 roll back along the second rails 120 in a horizontal state. The second rollers 420 are fitly received in the second rails 120. The first rollers 410 insert through the slot of the lateral walls of the second rails 120. When reaching the branching position of the first and second rails 110, 120, the first rollers 410 roll up into and along the first rails 110. The second rollers 420 continue to roll along the second rails 120, and cannot roll into the first rails 110 due to the larger diameter of the second rollers 420. When the first rollers 410 reach the top of the first rails 110, the second rollers 420 reach the rear end of the second rails 120, and the fan module 30 is fixed in the rear side of the server cabinet 10 and perpendicular to the second rails 120. The server 20, which is removed, is then loaded in the server cabinet 10 along the second rails 120.

It is noted that, the drawings only schematically show a working relationship among the first and second rollers 410, 420, and the first and second rails 110, 120 for illustrating an exemplary embodiment. An exact dimension or configuration of the first and second rollers 410, 420, and the first and second rails 110, 120 can be designed as desired.

Figure 8:
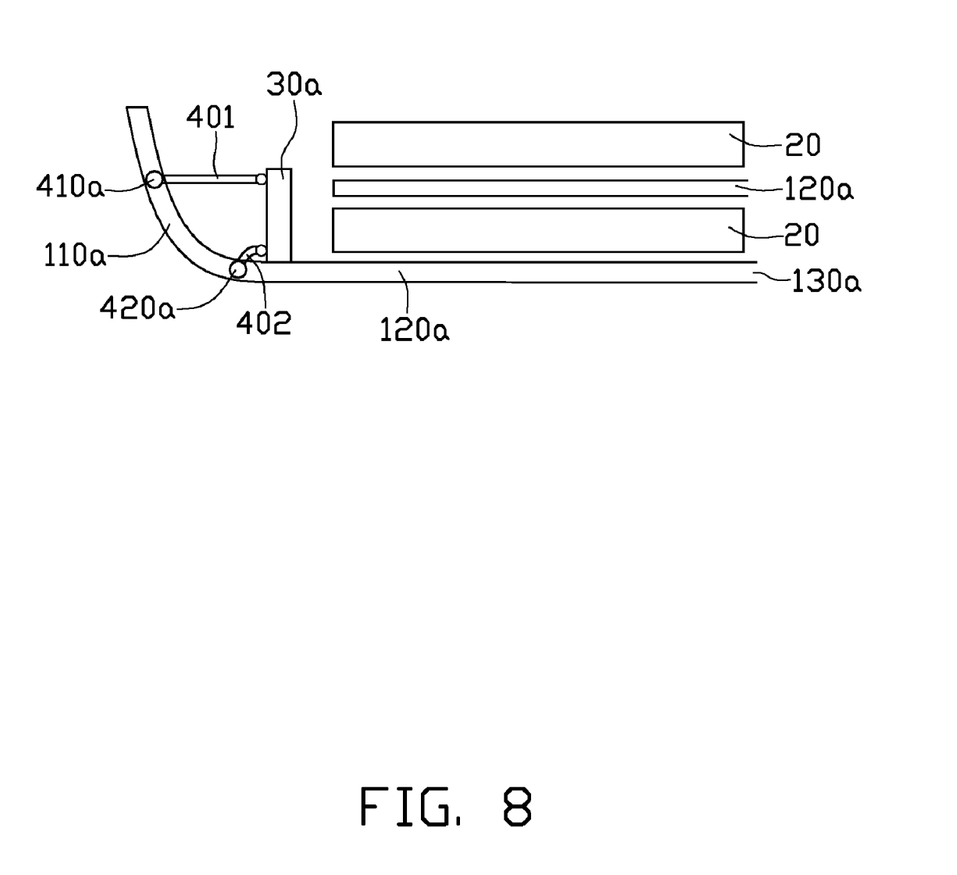
FIG. 8 is a schematic view of a server system in accordance with a second embodiment of the present disclosure, showing a relationship among a fan module, two servers, a pair of first rails and a pair of second rails.
Figure 9:
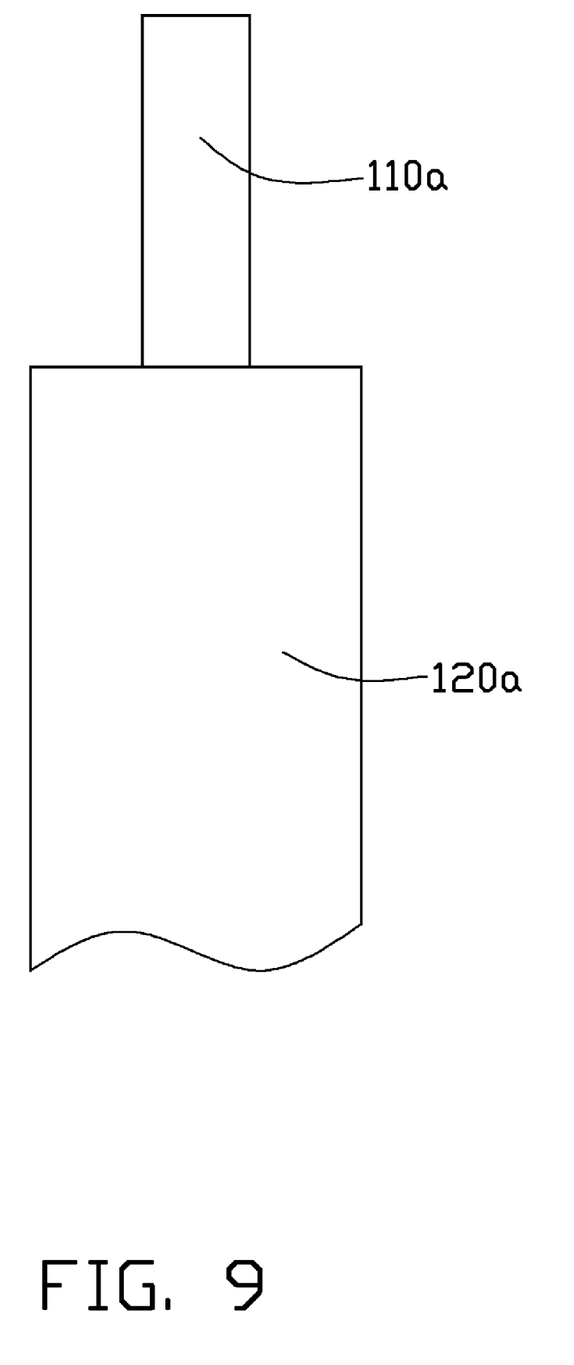
FIG. 9 is a schematic, top view showing a relationship between the first and second rails in FIG. 8.

FIGS. 8 and 9 illustrate a fan module 30a, and first and second rails 110a, 120a of a server system in accordance with a second embodiment of the present disclosure. A pair of first rollers 410a is formed on the upper portion of the rear side of the fan module 30a, and each first roller 410a is located adjacent to the lateral end of the fan module 30a. A pair of second rollers 420a is formed on the lower portion of the rear side of the fan module 30a, and each second roller 420a is located adjacent to the lateral end of the fan module 30a. The first roller 410a is fixed on the fan module 30a by a first pivot 401. The second roller 420a is fixed on the fan module 30a by a second pivot 402. The first pivot 401 is longer than the second pivot 402. The first and second pivots 401, 402 are capable of rotating around the fan module 30a. The first and second rollers 410a, 420a are round, and the first roller 410a is smaller than the second roller 420a.

The second rail 120a is straight and positioned in a horizontal plane. The first rail 110a has an arc shape and extends up from the rear end of the second rail 120a. The first rail 110a and the second rail 120a cooperate to form a rail system 130a. Cross sections of the first and second rails 110a, 120a are a U shape having an opening at top thereof. The second rail 120a is wider than the first rail 110a. The width of the first rail 110a is slightly larger than or substantially equal to the diameter of the first roller 410a. The width of the second rail 120a is slightly larger than or substantially equal to the diameter of the second roller 420a. Therefore, the first roller 410a is capable of rolling in the first and second rails 110a, 120a, but the second roller 420a is just capable of rolling in the second rail 120a. Other characters of the server system in this embodiment are similar to that in the previous embodiment; thus, a detailed description is omitted.

When the fan module 30a needs to be replaced, the lower server 20 is removed from the server cabinet 10 along the second rails 120a, providing a passage for the fan module 30a. The fan module 30a is then pulled out, the second rollers 420a roll forwards along the second rails 120a, and the first rollers 410a roll down along the first rails 110a, whereby the fan module 30a is turned from a vertical state into a horizontal state on the second rails 120a. Finally, the fan module 30a is removed along the second rails 120a.

In assembling the fan module 30a in the server cabinet 10, the fan module 30a is initially oriented in a horizontal state, and the first and second rollers 410a, 420a of the fan module 30a are pushed to roll back along the second rails 120a. When reaching the first rails 110a, the first rollers 410a roll up into and along the first rails 110a. The second rollers 420a continue to roll along the second rails 120a. The second rollers 420a stop at the rear end of the second rails 120a and cannot roll into the first rails 110a due to the larger diameter of the second rollers 420a. At the same time, the first rollers 410a reach the top of the first rails 110a, whereby the fan module 30a is fixed in the rear side of the server cabinet 10 and perpendicular to the second rails 120a. The server 20, removed previously is then loaded in the server cabinet 10 along the second rails 120a.

The sever system provided by the present disclosure can assemble or disassemble the fan module from the front side of the server cabinet and only need to remove a single server from the server system. Thus, there is no need to shut down the whole server system when one of the fan modules need to be repaired or replaced, and it is more convenient for the maintenance of the fan module since there is a greater amount of workspace at the front side of the server system.

It is to be understood, however, that even though numerous characteristics and advantages of the present disclosure have been set forth in the foregoing description, together with details of the structure and function of the embodiments. The disclosure is illustrative only, and changes may be made in detail, especially in matters of shape, size, and arrangement of parts within the principles of the disclosure to the full extent indicated by the broad general meaning of the terms in which the appended claims are expressed.

The invention claimed is:

1. A server cabinet, comprising:
   at least one fan module located vertically at a rear side of the server cabinet; and
   at least one rail system on which the at least one fan module is capable of gliding to a front side of the cabinet meanwhile the at least one fan module interchanges between a vertical state and a horizontal state, whereby assembly or disassembly of the at least one fan module is performed from the front side of the server cabinet;
   wherein the at least one rail system comprises a pair of first rails and a pair of second rails, the pair of second rails extending from the front side of the sever cabinet to the rear side of the sever cabinet, and the pair of first rails extending up from and communicating with the pair of second rails and adjacent to the rear side of the sever cabinet.

2. The server cabinet of claim 1, wherein the pair of first rails extends up from the rear ends of the pair of second rails.

3. The server cabinet of claim 1, wherein the pair of first rails curve out and up from a rear portion of the pair of the second rails, the curved position of the pair of first rails extending at the rear ends of the pair of second rails.

4. A server system, comprising:
   a server cabinet having a rail system therein;
   at least two servers accommodated in the server cabinet; and
   a fan module located at a rear side of the at least two servers and perpendicular to the at least two servers for providing a horizontal airflow to cool the at least two servers;
   wherein the fan module is capable of gliding on the rail system of the server cabinet between a rear side and a front side of the server cabinet to interchange between a vertical state and a horizontal state, whereby assembly or disassembly of the fan module is performed from the front side of the server cabinet; and
   wherein the rail system comprises a pair of first rails and a pair of second rails, the pair of second rails extending from the front side of the sever cabinet to the rear side of the sever cabinet, and the pair of first rails extending up from the pair of second rails and adjacent to the rear side of the sever cabinet.

5. The server system of claim 4, wherein the pair of first rails curve out and up from a rear portion of the pair of the second rails, the curved position of the pair of first rails being between the rear side of the at least two servers and the rear ends of the pair of second rails.

6. The server system of claim 4, wherein the pair of first rails extends up from the rear ends of the pair of second rails.

7. The server system of claim 6, wherein a pair of first rollers are formed at an upper portion of the fan module and received in the pair of first rails, and a pair of second rollers are formed at a lower portion of the fan module and received in the pair of second rails.

8. The server system of claim 7, wherein the pair of second rails are wider than the pair of first rails, and the pair of second rollers are larger than the pair of first rollers.

9. A data center comprising at least two server systems arranged back to back, each server system comprising:
- a server cabinet having a rail system therein;
- at least two servers accommodated in the server cabinet; and
- a fan module located at a rear side of the at least two servers and perpendicular to the at least two servers for providing a horizontal airflow to cool the at least two servers;
- wherein the fan module is capable of gliding on the rail system of the server cabinet between a rear side and a front side of the server cabinet to interchange between a vertical state and a horizontal state, whereby assembly or disassembly of the fan module is performed from the front side of the server cabinet; and
- wherein the rail system comprises a pair of first rails and a pair of second rails, the pair of second rails extending from the front side of the sever cabinet to the rear side of the sever cabinet, and the pair of first rails extending up from the pair of second rails and adjacent to the rear side of the sever cabinet.

10. The data center of claim 9, wherein the pair of first rails curve out and up from a rear portion of the pair of the second rails, the curved position of the pair of first rails being between the rear side of the at least two servers and the rear ends of the pair of second rails.

11. The data center of claim 9, wherein the pair of first rails extends up from the rear ends of the pair of second rails.

12. The data center of claim 11, wherein a pair of first rollers are formed at an upper portion of the fan module and received in the pair of first rails, and a pair of second rollers are formed at a lower portion of the fan module and received in the pair of second rails.

13. The data center of claim 9, wherein the at least two servers are located on the pair of second rails and capable of moving out of the server cabinet from the front side of the server cabinet along the pair of second rails.

* * * * *